(12) United States Patent
Frank et al.

(10) Patent No.: US 12,159,854 B2
(45) Date of Patent: Dec. 3, 2024

(54) SEMICONDUCTOR DEVICE HAVING A LAYER STACK, SEMICONDUCTOR ARRANGEMENT AND METHOD FOR PRODUCING THE SAME

(71) Applicant: Infineon Technologies Austria AG, Villach (AT)

(72) Inventors: Paul Frank, Finkenstein am Faaker See (AT); Thomas Heinelt, Dresden (DE); Oliver Schilling, Warstein (DE); Sven Schmidbauer, Dresden (DE); Frank Wagner, Ruethen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 18/397,457

(22) Filed: Dec. 27, 2023

(65) Prior Publication Data

US 2024/0128226 A1    Apr. 18, 2024

Related U.S. Application Data

(63) Continuation of application No. 17/687,797, filed on Mar. 7, 2022, now Pat. No. 11,887,961.

(30) Foreign Application Priority Data

Mar. 8, 2021 (EP) .................................. 21161250

(51) Int. Cl.
*H01L 23/00* (2006.01)
(52) U.S. Cl.
CPC .............. *H01L 24/29* (2013.01); *H01L 24/27* (2013.01); *H01L 24/32* (2013.01); *H01L 24/83* (2013.01);
(Continued)

(58) Field of Classification Search
CPC ......... H01L 24/27; H01L 24/32; H01L 24/29; H01L 24/03; H01L 24/05; H01L 24/83;
(Continued)

(56) References Cited

U.S. PATENT DOCUMENTS

| | | | |
|---|---|---|---|
| 2006/0202352 A1* | 9/2006 | Li | ......................... C23C 14/165 257/E23.021 |
| 2008/0194095 A1* | 8/2008 | Daubenspeck | ..... H01L 23/3192 438/612 |

(Continued)

FOREIGN PATENT DOCUMENTS

JP         2009016468 A        1/2009

OTHER PUBLICATIONS

Li, Yanping, et al., "Magnetron Sputtering of Nickel Silicon Alloy as Thin Film UBM for Pb-free Flip Chip Packaging", Conference Proceedings AMC XXI 2006; Materials Research Society, 2006, 185-189.

(Continued)

*Primary Examiner* — Mouloucoulaye Inoussa
(74) *Attorney, Agent, or Firm* — Murphy, Bilak & Homiller, PLLC

(57) ABSTRACT

A semiconductor device includes a semiconductor wafer or a single semiconductor chip or die, and a layer stack. The layer stack comprises a first layer comprising NiSi, and a second layer comprising NiV, wherein the second layer is arranged between the first layer and the semiconductor wafer or single semiconductor chip or die.

13 Claims, 3 Drawing Sheets

(52) U.S. Cl.
CPC ............... *H01L 2224/29082* (2013.01); *H01L 2224/29083* (2013.01); *H01L 2224/29155* (2013.01); *H01L 2224/32245* (2013.01); *H01L 2924/3511* (2013.01); *H01L 2924/37001* (2013.01)

(58) Field of Classification Search
CPC ... H01L 23/4827; H01L 23/564; H01L 24/06; H01L 24/40; H01L 24/48; H01L 24/02; H01L 24/13; H01L 24/11; H01L 23/42; H01L 23/3735; H01L 33/64; H01L 23/4334; H01L 23/293; H01L 23/367; H01L 24/73; H01L 24/04; H01L 21/563; H01L 23/3114; H01L 21/2855; H01L 29/861; H01L 21/28518; H01L 2224/29155; H01L 2224/3201; H01L 2224/2929; H01L 2224/83203; H01L 2224/04026; H01L 2224/32245; H01L 2224/05155; H01L 2224/48227; H01L 2224/05639; H01L 2224/293; H01L 2224/05082; H01L 2924/3511; H01L 2224/05655; H01L 2224/32227; H01L 2224/8381; H01L 2224/03901; H01L 2224/05624; H01L 2924/37001; H01L 2224/40227; H01L 2224/29111; H01L 2924/351; H01L 2224/29082; H01L 2224/291; H01L 2224/29339; H01L 2224/02321; H01L 2224/1316; H01L 2224/02311; H01L 2224/05186; H01L 2224/0236; H01L 2224/13147; H01L 2924/01029; H01L 2224/1145; H01L 2924/18161; H01L 2924/181; H01L 2224/16225; H01L 2224/73253; H01L 2224/13111; H01L 2224/05008; H01L 2924/3512; H01L 2224/0346; H01L 2224/06154; H01L 2224/13022; H01L 2224/13139; B33Y 70/00; B33Y 80/00; H05K 1/0209

See application file for complete search history.

(56) References Cited

U.S. PATENT DOCUMENTS

| | | | |
|---|---|---|---|
| 2008/0203571 A1* | 8/2008 | Jungnickel | H01L 24/97 438/653 |
| 2011/0006409 A1* | 1/2011 | Gruenhagen | H01L 24/05 257/737 |
| 2011/0074031 A1* | 3/2011 | Zenner | H01L 24/05 438/654 |
| 2018/0082848 A1* | 3/2018 | Frank | H01L 24/03 |
| 2020/0044031 A1* | 2/2020 | Pham | H01L 24/05 |
| 2021/0242034 A1* | 8/2021 | Otto | H01L 24/05 |
| 2022/0235470 A1* | 7/2022 | Roy | H01L 21/32134 |

OTHER PUBLICATIONS

Li, Y, et al., "Nickel silicon thin film as barrier in under-bump-metallization by magnetron sputtering deposition for Pb- free chip packing", Journal of Materials Research, vol. 20, No. 10, Oct. 2005, 2622-2626.

* cited by examiner

SEMICONDUCTOR DEVICE HAVING A LAYER STACK, SEMICONDUCTOR ARRANGEMENT AND METHOD FOR PRODUCING THE SAME

TECHNICAL FIELD

The instant disclosure relates to a semiconductor device, a semiconductor arrangement, and to a method for producing the same.

BACKGROUND

Power semiconductor module arrangements often include a substrate. A semiconductor arrangement including at least one (controllable) semiconductor device (e.g., two IGBTs in a half-bridge configuration) is arranged on the substrate. A substrate usually comprises at least one electrically conducting layer. Substrates can comprise, for example, a substrate layer (e.g., a ceramic layer), a first metallization layer deposited on a first side of the substrate layer and a second metallization layer deposited on a second side of the substrate layer. The semiconductor devices are mounted, for example, on the first metallization layer. The second metallization layer is usually attached to a base plate or a heat sink. Each of the semiconductor devices often includes a silicon die. When mounting the at least one semiconductor device to an electrically conductive layer (e.g., first metallization layer of a substrate), e.g., by soldering techniques, several requirements are to be fulfilled to allow for an optimized performance of the arrangement.

There is a need for a semiconductor arrangement in which the reliability of the connection formed between a semiconductor device and an electrically conductive layer is satisfactory. Further, it is desirable that the connection formed between the semiconductor device and the electrically conductive layer is not prone to corrosion. The production costs of the semiconductor device and the semiconductor arrangement should be low while the yield should be high by reducing chip and wafer warpage.

SUMMARY

A semiconductor device includes a semiconductor wafer or a single semiconductor chip or die, and a layer stack. The layer stack comprises a first layer comprising NiSi, and a second layer comprising NiV, wherein the second layer is arranged between the first layer and the semiconductor wafer or single semiconductor chip or die.

A semiconductor arrangement includes the semiconductor device, an electrically conductive layer, and an electrically conductive connection layer arranged between and electrically and mechanically coupling the semiconductor device to the electrically conductive layer.

A method includes forming a layer stack on a semiconductor wafer or a single semiconductor chip or die, wherein forming the layer stack includes forming a second layer comprising NiV on the single semiconductor chip or die, and forming a first layer comprising NiSi on the second layer such that the second layer is arranged between the first layer and the semiconductor wafer or single semiconductor chip or die.

The invention may be better understood with reference to the following drawings and the description. The components in the figures are not necessarily to scale, emphasis instead being placed upon illustrating the principles of the invention. Moreover, in the figures, like referenced numerals designate corresponding parts throughout the different views.

DETAILED DESCRIPTION

In the following detailed description, reference is made to the accompanying drawings. The drawings show specific examples in which the invention may be practiced. It is to be understood that the features and principles described with respect to the various examples may be combined with each other, unless specifically noted otherwise. In the description as well as in the claims, designations of certain elements as "first element", "second element", "third element" etc. are not to be understood as enumerative. Instead, such designations serve solely to address different "elements". That is, e.g., the existence of a "third element" does not necessarily require the existence of a "first element" and a "second element". An electrical line or electrical connection as described herein may be a single electrically conductive element, or include at least two individual electrically conductive elements connected in series and/or parallel. Electrical lines and electrical connections may include metal and/or semiconductor material, and may be permanently electrically conductive (i.e., non-switchable). A semiconductor body or semiconductor device or die as described herein may be made from (doped) semiconductor material and may be a semiconductor chip or be included in a semiconductor chip. A semiconductor body has electrically connectable pads and includes at least one semiconductor element with electrodes.

Figure 1:
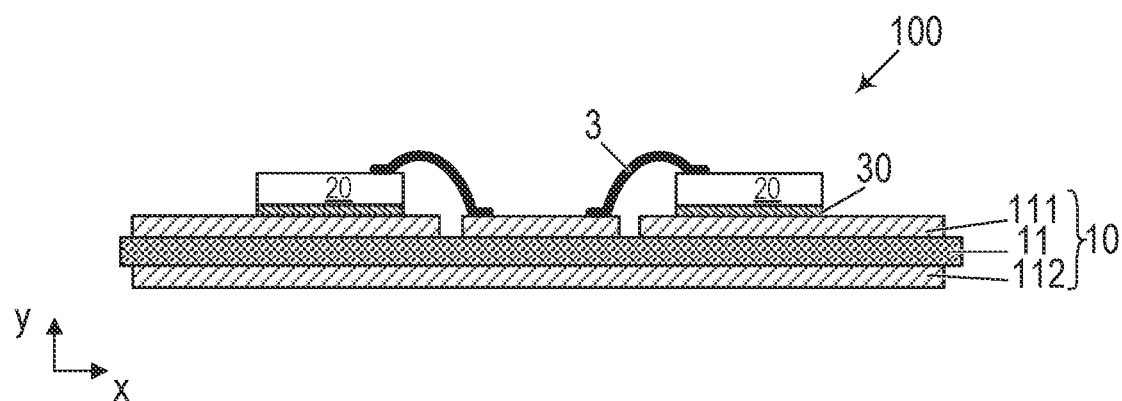
FIG. 1 is a cross-sectional view of a power semiconductor module arrangement.

Referring to FIG. 1, a cross-sectional view of a power semiconductor module arrangement 100 is illustrated. The power semiconductor module arrangement 100 includes a substrate 10. The substrate 10 includes a dielectric insulation layer 11, a (structured) first metallization layer 111 attached to the dielectric insulation layer 11, and a (structured) second metallization layer 112 attached to the dielectric insulation layer 11. The dielectric insulation layer 11 is disposed between the first and second metallization layers 111, 112.

Each of the first and second metallization layers 111, 112 may consist of or include one of the following materials: copper; a copper alloy; aluminum; an aluminum alloy; any other metal or alloy that remains solid during the operation of the power semiconductor module arrangement. The substrate 10 may be a ceramic substrate, that is, a substrate in which the dielectric insulation layer 11 is a ceramic, e.g., a thin ceramic layer. The ceramic may consist of or include one of the following materials: aluminum oxide; aluminum nitride; zirconium oxide; silicon nitride; boron nitride; or any other dielectric ceramic. Alternatively, the dielectric insulation layer 11 may consist of an organic compound and include one or more of the following materials: $Al_2O_3$, AlN, SiC, BeO, BN, or $Si_3N_4$. For instance, the substrate 10 may, e.g., be a Direct Copper Bonding (DCB) substrate, a Direct Aluminum Bonding (DAB) substrate, or an Active Metal Brazing (AMB) substrate. Further, the substrate 10 may be an Insulated Metal Substrate (IMS). An Insulated Metal Substrate generally comprises a dielectric insulation layer 11 comprising (filled) materials such as epoxy resin or polyimide, for example. The material of the dielectric insulation layer 11 may be filled with ceramic particles, for example. Such particles may comprise, e.g., $Si_2O$, $Al_2O_3$, AlN, SiN or BN and may have a diameter of between about 1 µm and about 50 µm. The substrate 10 may also be a conventional printed circuit board (PCB) having a non-ceramic dielectric insulation layer 11. For instance, a non-ceramic dielectric insulation layer 11 may consist of or include a cured resin.

The substrate 10 can be arranged on a base plate or on a heat sink (not specifically illustrated), for example. In some semiconductor arrangements 100, more than one substrate 10 is arranged on the same base plate or heat sink.

One or more semiconductor devices 20 can be arranged on the at least one substrate 10. Each of the semiconductor devices 20 arranged on the at least one substrate 10 can include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), or any other suitable semiconductor element.

The one or more semiconductor devices 20 can form a circuit arrangement on the substrate 10. In FIG. 1, only two semiconductor devices 20 are exemplarily illustrated. The second metallization layer 112 of the substrate 10 in FIG. 1 is a continuous layer. According to another example, the second metallization layer 112 can be a structured layer. According to other examples, the second metallization layer 112 can be omitted altogether. The first metallization layer 111 is a structured layer in the example illustrated in FIG. 1. "Structured layer" in this context means that the respective metallization layer is not a continuous layer, but includes recesses between different sections of the layer. Such recesses are schematically illustrated in FIG. 1. The first metallization layer 111 in this example includes three different sections. Different semiconductor devices 20 can be mounted on the same or on different sections of the first metallization layer 111. Different sections of the first metallization layer can have no electrical connection or can be electrically connected to one or more other sections using electrical connections 3 such as, e.g., bonding wires. Semiconductor devices 20 can be electrically connected to each other or to the first metallization layer 111 using electrical connections 3, for example. Electrical connections 3, instead of bonding wires, can also include bonding ribbons, connection plates or conductor rails, for example, to name just a few examples. The one or more semiconductor devices 20 can be electrically and mechanically connected to the substrate 10 by an electrically conductive connection layer 30. Such an electrically conductive connection layer 30 can be a solder layer, a layer of an electrically conductive adhesive, or a layer of a sintered metal powder, e.g., a sintered silver (Ag) powder, for example.

At least some semiconductor devices 20 of the power semiconductor module arrangement 100 generally perform a plurality of switching operations during the operation of the power semiconductor module arrangement 100. When performing many switching operations within a short period of time, for example, the semiconductor devices 20 generate heat which, in the worst case, may rise to a temperature above a certain maximum threshold. Temperatures above such a maximum threshold may adversely affect the operation of the power semiconductor module, or even lead to the total failure of one or more semiconductor devices 20. Heat generated during the operation of the power semiconductor module arrangement 100 is usually dissipated from the substrate 10 to a heat sink, e.g., through a base plate (not specifically illustrated in FIG. 1). The electrically conductive connection layer 30, therefore, needs to have a satisfactory resistance to thermomechanical stress such as, e.g., powercycling, high temperature forward bias, inverter tests like static or cyclic endurance.

Figure 2:
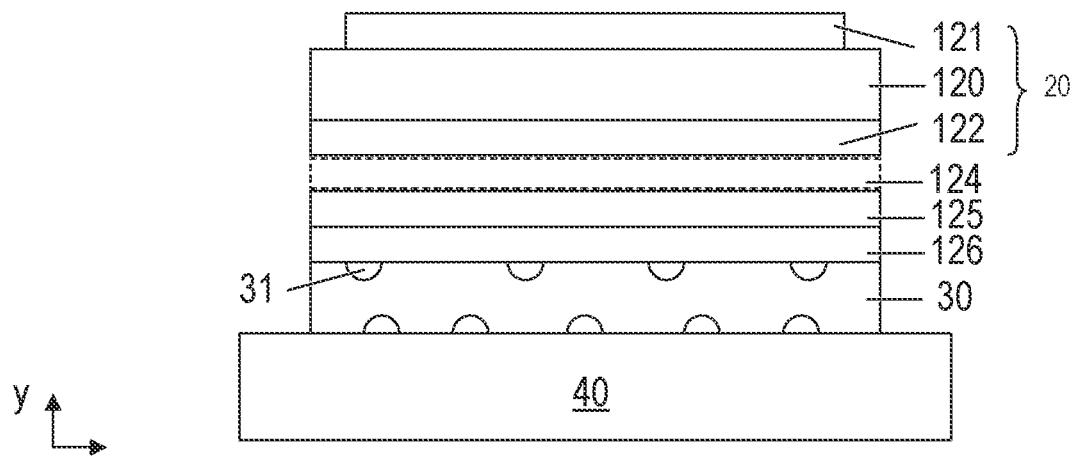
FIG. 2 is a cross-sectional view of a semiconductor arrangement.

Now referring to FIG. 2, a semiconductor arrangement is schematically illustrated. The semiconductor arrangement comprises a semiconductor device 20 and an electrically conductive layer 40. The electrically conductive layer 40 can be a metallization layer 111 of a substrate 10, for example, as has been described with respect to FIG. 1 above. The semiconductor device 20 is mechanically and electrically coupled to the electrically conductive layer 40 by means of an electrically conductive connection layer 30. The semiconductor device 20 comprises a layer stack. The layer stack comprises a plurality of layers. The layer stack can have any suitable size or form.

The layer stack comprises a first layer 126 configured to function as a reaction partner for an electrically conductive connection layer (e.g., solder deposit) 30 during a mounting process (e.g., soldering). The electrically conductive connection layer 30 can comprise Sn, for example. The first layer 126 comprises a nickel silicon (NiSi) composition and can, in particular, consist of NiSi. NiSi may exhibit superior properties as a first layer 126 as compared to other materials like for example pure nickel, or a nickel vanadium (NiV) composition. For example, NiSi may react slower with Sn during soldering as compared to Ni or NiV. Therefore, a first layer 126 comprising NiSi can be comparably thin. This can reduce the fabrication time and cost of the metal stack and can also minimize wafer bow or chip bow caused by the difference in the Coefficient of Thermal Expansion (CTE) of a semiconductor wafer or a single semiconductor chip or die 120 (see below) and the metal stack.

The first layer 126 can be fabricated using various deposition techniques known in the art. For example, the first layer 126 can be fabricated using (magnetron) sputtering. Unlike pure Ni, NiSi is not ferromagnetic and therefore does not interfere with the magnetron of a deposition chamber.

(Magnetron) sputtering can be performed in the presence of a process gas. The process gas can comprise a noble gas, for example Ar, Xe, Kr or Ne. In many cases the process gas comprises $N_2$ (nitrogen). According to one example, however, no nitrogen is added to the process gas. In this way, impurities that may be caused by nitrogen in the first layer 126 can be prevented. This can improve the reliability of the connection formed between the semiconductor device 20 and the electrically conductive layer 40.

The semiconductor device 20 further comprises a semiconductor wafer or a single semiconductor chip or die 120. The semiconductor device 20 can further comprise a chip pad or metal contact layer 122 arranged on a bottom surface of the semiconductor wafer, chip or die 120 and the layer stack can be disposed on and electrically connected to the metal contact layer 122. The layer stack can be configured to provide an electrical connection between the chip pad or metal contact layer 122 and the electrically conductive layer 40 to which the semiconductor device 20 is attached. The layer stack can completely cover a surface of the semiconductor wafer or single semiconductor chip or die 120 or of the chip pad or metal contact layer 122, or it can cover the respective surface only partially. The semiconductor device 20 can further comprise a front side metallization layer 121 arranged on a top surface of the semiconductor wafer, chip or die 120. The top surface of the semiconductor wafer, chip or die 120 is a surface opposite the bottom surface and facing away from the layer stack. The chip pad or metal contact layer 122 and the front side metallization layer 121 each can comprise a metal such as, e.g., Al or Cu.

The first layer 126 can have any appropriate thickness depending on the respective requirements on the first layer 126, wherein a thickness is measured along a direction perpendicular to the bottom surface of the semiconductor wafer, chip or die 120. The first layer 126 can have a thickness in the range of 100 nm to 1000 nm, for example, in order to reduce the chip or wafer bow and allow for a high throughput of the sputter process when forming the first layer 126 while at the same time providing an amount of Ni which is high enough for forming a reliable solder connection. The content of Si in the first layer 126 can be between 1 and 10%, for example.

The layer stack further comprises a second layer 125. The second layer 125 is arranged between the first layer 126 and the semiconductor wafer, chip or die 120. The second layer 125 comprises NiV. According to one example, the second layer 125 comprises an amount of V in the range of 1 to 10%. The second layer 125 can have a thickness of between 100 nm and 500 nm, for example. The thickness of the second layer 125 is a thickness in a direction perpendicular to the bottom surface of the semiconductor wafer, chip or die 120.

The second layer 125 can be fabricated using various deposition techniques known in the art. For example, the second layer 125 can be fabricated using (magnetron) sputtering.

(Magnetron) sputtering can be performed in the presence of a process gas. The process gas can comprise a noble gas, for example Ar, Xe, Kr or Ne. In many cases the process gas comprises $N_2$ (nitrogen). According to one example, however, no nitrogen is added to the process gas. In this way, impurities that may be caused by nitrogen in the second layer 125 can be prevented. This can improve the reliability of the connection formed between the semiconductor device 20 and the electrically conductive layer 40.

The layer stack can comprise additional layers apart from the first layer 126 and the second layer 125. For example, the layer stack can comprise a third layer 124, wherein the third layer 124 is arranged between the second layer 125 and the semiconductor wafer, chip or die 120. The third layer 124 can act as a barrier layer and can prevent the diffusion of impurities into the semiconductor wafer, chip or die 120. The third layer 124 can have any appropriate thickness between 100 nm and 1000 nm such as, e.g., a thickness of about or exactly 200 nm. The third layer 124 can comprise any suitable material such as, e.g., one or more of Ti, WTi, Ta or an alloy comprising at least one of these materials. The third layer 124, however, is optional (indicated with dashed lines in the figures).

As has been mentioned above, the semiconductor arrangement further comprises an electrically conductive connection layer 30 such as a solder layer, for example, arranged between the electrically conductive layer 40 and the semiconductor device 20. The electrically conductive connection layer 30 can comprise, e.g., SnAg or Sn, or any other suitable material.

Figure 3:
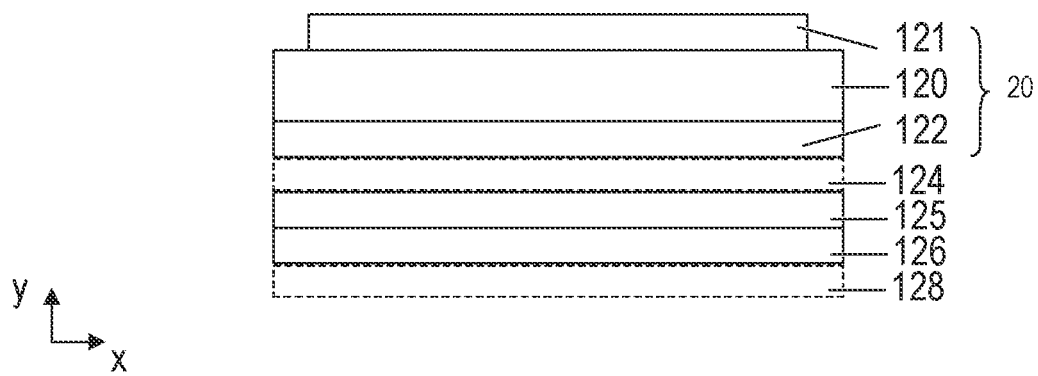
FIG. 3 is a cross-sectional view of a semiconductor device.

FIG. 3 exemplarily illustrates a semiconductor device 20 according to one example. The semiconductor device 20 of FIG. 3 essentially corresponds to the semiconductor device 20 of the arrangement described with respect to FIG. 2. According to one example, the layer stack comprises an even further layer. A fourth layer 128 can be arranged on the first layer 126, such that the first layer 126 is arranged between the fourth layer 128 and the second layer 125. The fourth layer 128 may be configured to protect the first layer 126 from corrosion. The fourth layer 128 may comprise or consist of any suitable material or material composition. For example, the fourth layer 128 may comprise one or more of Ag, Pt, Pd and Au. The fourth layer 128 may have a thickness in the range of 50 nm to 2000 nm, or in the range of 100 nm to 1000 nm, or in the range of 150 nm to 500 nm, or in the range of 200 nm to 300 nm. According to one example, a thickness of the fourth layer 128 is 200 nm. A thickness of the fourth layer 128 is a thickness in a direction perpendicular to a surface on which the first layer 126 is arranged. The fourth layer 128, however, is optional.

The layer stack of the resulting semiconductor arrangement (see FIG. 2) can be identical to the layer stack of the semiconductor device 20 of FIG. 3, except for changes introduced by connecting (e.g., soldering) the semiconductor device 20 to the electrically conductive layer 40 by means of the electrically conductive connection layer 30. According to one example of a semiconductor arrangement that is produced using a soldering process, the first layer 126 may be thinner after soldering than before soldering. The first layer 126 may, for example, be one quarter thinner, one half thinner, three quarters thinner or there may even be no first layer 126 in the layer stack after soldering. The first layer 126 can also be almost completely consumed by the soldering process except for some patches comprising NiSi which may remain in the metal stack after soldering. Such patches can be located between the electrically conductive connection layer 30 and the second layer 125. The patches can comprise a higher concentration of Si than the precursor first layer 126 because Ni may be "drawn out" during soldering. For example, in the case that the first layer 126 comprises 4.5% Si, the patches may comprise about four times more Si or in other words about 20% Si. If the layer stack comprises a fourth layer 128, the fourth layer 128 may dissolve into the electrically conductive connection layer 30 when connecting the semiconductor device 20 to the electrically conductive layer 40.

According to one example, the layer stack of a semiconductor arrangement can comprise intermetallic phases 31 formed between the remaining first layer 126 and the electrically conductive connection layer 30. Intermetallic phases 31 can be a result of a soldering process that is performed in order to connect the semiconductor device 20 to the electrically conductive layer 40. The intermetallic phases 31 can comprise both material of the first layer 126 and material of the electrically conductive connection layer 30. In the semiconductor arrangement of FIG. 2, the intermetallic phases 31 are illustrated comparably small and the first layer 126 is essentially intact. This, however, is only an example. There may be any number of intermetallic phases 31 of any size. If the first layer 126 is mostly or completely consumed during the soldering process leaving only a very thin or no first layer 126 after the soldering process, intermetallic phases 31 may also comprise a certain amount of material of the second layer 125. However, during the soldering process, the second layer 125 is not consumed by the electrically conductive connection layer 30 at all, or only partly consumed by the electrically conductive connection layer 30. That is, the entire second layer 125 or at least some of the second layer 125 is still present after soldering the semiconductor device 20 to the electrically conductive layer 40.

As has been described above, according to one example of a semiconductor device, a first layer 126 comprising NiSi and a second layer 125 comprising NiV are arranged on a semiconductor wafer or a single semiconductor chip or die 120, with the second layer 125 being arranged between the first layer 126 and the semiconductor wafer or single semiconductor chip or die 120. Such an arrangement provides several advantages in particular with respect to electrical, thermal and mechanical functionality. The semiconductor device 20 and the semiconductor arrangement as described above provide a high reliability against thermomechanical stress. This is, because the second layer 125 comprising NiV provides for a good adhesion between the semiconductor device 20 and the electrically conductive layer 40. The content of V (vanadium) in the second layer 125 supports the good adhesion properties of Ni (nickel). However, a layer comprising NiV exhibits high intrinsic stress which may lead to unwanted wafer warpage. This disadvantage is reduced or even avoided by means of the first layer 126 comprising NiSi. By providing the first layer 126 between the second layer 125 and the electrically conducting connection layer 30, the full consumption of the second layer 125 during the soldering process can be avoided such that at least a part of the second layer 125 remains intact after the soldering process. That is because a layer comprising NiSi has a lower consumption rate towards solder as compared to a layer comprising NiV. Further, the first layer 126 can be formed without generating high intrinsic stress on the semiconductor wafer, chip or die 120.

Summarizing the above, a thin second layer 125 comprising NiV provides an interface layer with good adhesion properties, while a first layer 126 comprising NiSi provides a sufficient thickness of a layer containing Ni during the soldering process while keeping the wafer warpage low.

Figure 4:
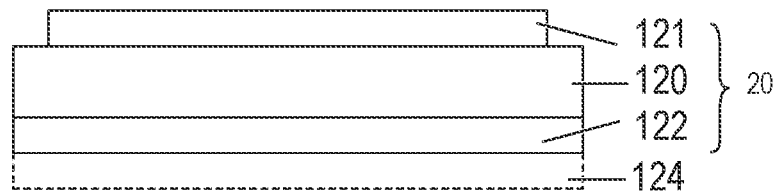
FIGS. 4-7 schematically illustrate a method for producing a semiconductor device and a semiconductor arrangement.

Now referring to FIGS. 4 to 7, a method for producing a semiconductor device and a semiconductor arrangement is schematically illustrated. In a first, optional step, a third layer 124 can be formed on a semiconductor wafer or single semiconductor chip or die 120. As has been described above, the semiconductor wafer or single semiconductor chip or die 120 can comprise a chip pad or metal contact layer 122 arranged on a bottom surface of the semiconductor wafer, chip or die 120 and the third layer 124 can be disposed on and electrically connected to the metal contact layer 122. This is schematically illustrated in FIG. 4. This step, however, is optional and it is also possible that the third layer 124 be omitted.

Figure 5:
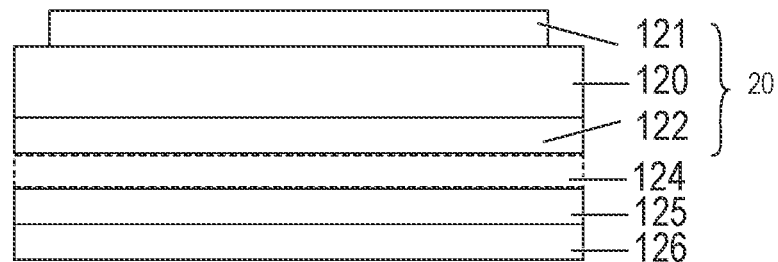
Figure 6:
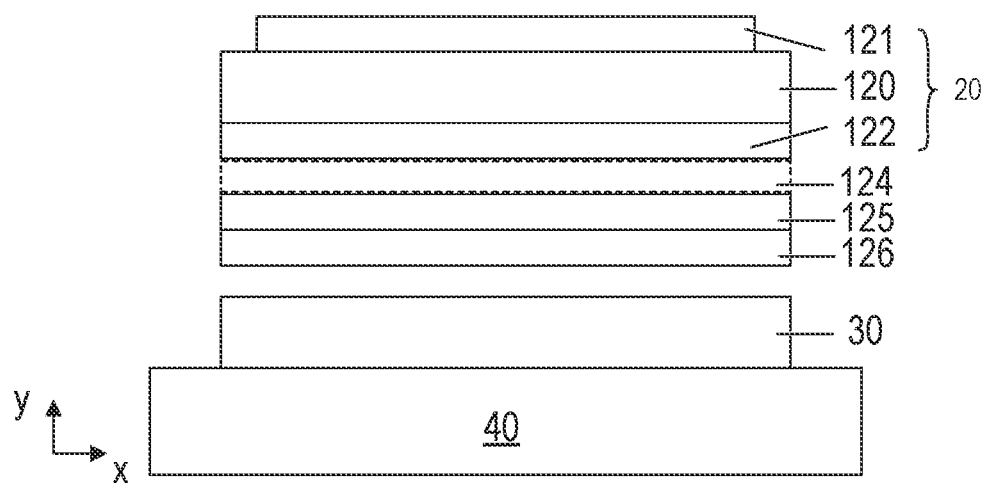

Now referring to FIG. 5, a second layer 125 and a first layer 126 can be formed on the semiconductor wafer, chip or die 120. If a third layer 124 is formed first, the second layer 125 is formed on the third layer 124 such that the third layer 124 is arranged between the semiconductor wafer, chip or die 120 and the second layer 125. If the third layer 124 is omitted, the second layer 125 can be formed on the semiconductor wafer, chip or die 120 or on the chip pad or metal contact layer 122, respectively. The first layer 126 is formed on the second layer 125 such that the second layer 125 is arranged between the first layer 126 and the semiconductor wafer, chip or die 120. The second layer 125 and the first layer 126 can be formed in two separate subsequent steps. According to one example, forming the second layer 125 and forming the first layer 126 each comprises a separate sputtering process or any other process suitable to form an even layer.

Figure 7:
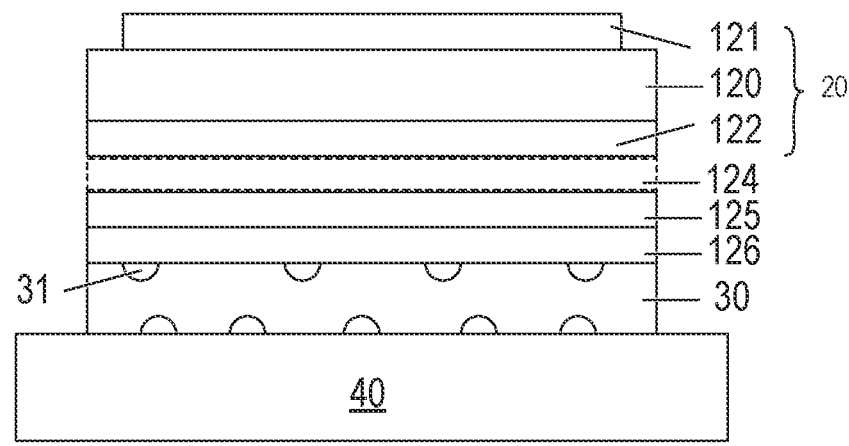

The semiconductor device 20 formed by means of the process described with respect to FIGS. 4 and 5 above can then be mounted to an electrically conductive layer 40 to form a semiconductor arrangement. Now referring to FIG. 6, an electrically conductive connection layer 30 is formed on the electrically conductive layer 40. The electrically conductive connection layer 30 can be a solder layer, for example, as has been described above. The electrically conductive connection layer 30 can be formed by means of any suitable process. The semiconductor device 20 is then arranged on the electrically conductive connection layer 30 and a permanent electrical and mechanical connection is formed between the semiconductor device 20 and the electrically conductive layer 40. According to one example, heat can be applied in order to form a permanent electrical and mechanical connection between the semiconductor device 20 and the electrically conductive layer 40. While applying heat, the semiconductor device 20 can be pressed on the electrically conductive connection layer 30. The semiconductor arrangement after forming the connection between the semiconductor device 20 and the electrically conductive layer 40 is schematically illustrated in FIG. 7. The resulting semiconductor arrangement of FIG. 7 essentially corresponds to the semiconductor arrangement that has been described with respect to FIG. 2 above.

What is claimed is:

1. A semiconductor device, comprising:
a semiconductor wafer or a single semiconductor chip or die; and
a layer stack,
wherein the layer stack comprises a first layer comprising NiSi, and a second layer comprising NiV,
wherein the first layer is configured to function as a reaction partner for an electrically conductive connection layer during a process of mounting the semiconductor device to an electrically conductive layer via the electrically conductive connection layer,
wherein the second layer is configured to provide for an adhesion between the semiconductor device and the electrically conductive layer,
wherein the second layer is arranged between the first layer and the semiconductor wafer or single semiconductor chip or die,
wherein the second layer directly adjoins the first layer.

2. The semiconductor device of claim 1, wherein the first layer comprises a content of Si of between 1 and 10%.

3. The semiconductor device of claim 1, wherein the second layer comprises a content of V of between 1 and 10%.

4. The semiconductor device of claim 1, wherein the first layer has a thickness in the range of 100 nm to 1000 nm.

5. The semiconductor device of claim 1, wherein the second layer has a thickness of between 100 nm and 500 nm.

6. The semiconductor device of claim 1, further comprising a chip pad or metal contact layer arranged on a bottom surface of the semiconductor wafer, chip or die, wherein the layer stack is disposed on and electrically connected to the metal contact layer.

7. The semiconductor device of claim 1, further comprising a front side metallization layer arranged on a top surface of the semiconductor wafer, chip or die, wherein the top surface of the semiconductor wafer, chip or die is a surface opposite the bottom surface and facing away from the layer stack.

8. The semiconductor device of claim 1, further comprising a third layer, wherein the third layer is arranged between the second layer and the semiconductor wafer, chip or die.

9. The semiconductor device of claim 8, wherein the third layer has a thickness of between 100 nm and 1000 nm.

10. The semiconductor device of claim 8, wherein the third layer comprises Ti, WTi, Ta or an alloy comprising at least one of these materials.

11. A method, comprising:
forming a semiconductor device, including forming a layer stack on a semiconductor wafer or a single semiconductor chip or die,
wherein forming the layer stack comprises:
forming a second layer comprising NiV on the single semiconductor chip or die, and
forming a first layer comprising NiSi on and directly adjoining the second layer such that the second layer is arranged between the first layer and the semiconductor wafer or single semiconductor chip or die,
wherein the first layer is configured to function as a reaction partner for an electrically conductive connection layer during a process of mounting the semiconductor device to an electrically conductive layer via the electrically conductive connection layer,
wherein the second layer is configured to provide for an adhesion between the semiconductor device and the electrically conductive layer.

12. The method of claim 11, further comprising:
forming the electrically conductive connection layer on the electrically conductive layer.

13. The method of claim 12, further comprising:
arranging the semiconductor device on the electrically conductive connection layer; and
forming a permanent electrical and mechanical connection between the semiconductor device and the electrically conductive layer by means of the electrically conductive connection layer.

* * * * *